(12) United States Patent
Kalis

(10) Patent No.: US 6,368,115 B2
(45) Date of Patent: Apr. 9, 2002

(54) METHOD AND APPARATUS FOR CONNECTING CIRCUIT BOARDS

(75) Inventor: Robert M. Kalis, Overland Park, KS (US)

(73) Assignee: Garmin Corporation (TW)

( * ) Notice: Subject to any disclaimer, the term of this patent is extended or adjusted under 35 U.S.C. 154(b) by 0 days.

(21) Appl. No.: 09/765,191

(22) Filed: Jan. 18, 2001

Related U.S. Application Data

(62) Division of application No. 09/208,905, filed on Dec. 10, 1998, now Pat. No. 6,215,671.

(51) Int. Cl.[7] .................................................. H05K 1/11
(52) U.S. Cl. ................................................................ 439/65
(58) Field of Search .................... 439/65, 75; 361/752, 361/784, 799, 816, 776, 803

(56) References Cited

U.S. PATENT DOCUMENTS

| | | | |
|---|---|---|---|
| 2,740,097 A | * 3/1956 | Edelman et al. ............ 361/786 |
| 3,780,430 A | * 12/1973 | Feeney ........................ 439/55 |
| 3,831,063 A | * 8/1974 | Keough ....................... 361/680 |
| 4,780,604 A | 10/1988 | Hasegawa et al. .......... 235/492 |
| 4,780,791 A | 10/1988 | Morita et al. ............... 361/395 |
| 4,780,793 A | 10/1988 | Ohtsuki ...................... 361/399 |
| 4,872,091 A | 10/1989 | Maniwa et al. ............. 361/424 |
| 4,905,124 A | 2/1990 | Banjo et al. ................ 361/395 |
| 4,974,120 A | 11/1990 | Kodai et al. ................ 361/392 |
| 5,017,767 A | 5/1991 | Mizuno ....................... 235/492 |
| 5,031,076 A | 7/1991 | Kiku .......................... 361/424 |
| 5,053,613 A | 10/1991 | Onoda ........................ 235/492 |
| 5,068,765 A | 11/1991 | Nimpoeno ................... 361/422 |
| 5,151,774 A | 9/1992 | Mori et al. .................. 357/79 |
| 5,153,818 A | 10/1992 | Mukougawa et al. ....... 361/395 |
| 5,161,169 A | 11/1992 | Galano et al. ................ 375/8 |
| 5,173,840 A | 12/1992 | Kodai et al. ................ 361/395 |
| 5,216,430 A | 6/1993 | Rahm et al. ................ 343/700 |
| 5,297,051 A | 3/1994 | Arakawa et al. ........... 364/449 |
| 5,319,516 A | 6/1994 | Perkins ....................... 361/220 |
| 5,330,360 A | 7/1994 | Marsh et al. ................ 439/76 |
| 5,335,145 A | 8/1994 | Kusui ........................ 361/737 |
| 5,339,222 A | 8/1994 | Simmons et al. ........... 361/818 |
| 5,357,402 A | 10/1994 | Anhalt ....................... 361/753 |
| 5,358,135 A | 10/1994 | Robbins et al. ............. 220/337 |
| 5,375,037 A | 12/1994 | Le Roux .................... 361/684 |
| 5,386,340 A | 1/1995 | Kurz .......................... 361/737 |
| 5,397,857 A | 3/1995 | Farquhar et al. ........... 174/52.1 |
| 5,414,253 A | 5/1995 | Baudouin et al. ........... 235/492 |
| 5,440,448 A | 8/1995 | Stewart et al. .............. 361/684 |
| 5,440,451 A | 8/1995 | Saito et al. ................. 361/760 |
| 5,446,622 A | 8/1995 | Landry et al. .............. 361/737 |
| 5,476,241 A | 12/1995 | Helman ..................... 248/286.1 |
| 5,526,235 A | 6/1996 | Beason et al. .............. 361/799 |
| 5,711,013 A | * 1/1998 | Collett et al. ............... 455/558 |

* cited by examiner

Primary Examiner—Neil Abrams
(74) Attorney, Agent, or Firm—Devon A. Rolf

(57) ABSTRACT

A circuit board assembly is provided for electrically coupling together two or more circuit boards, with one circuit board oriented at an acute angle relative to the other circuit board. The assembly includes a first circuit board having a first edge and a plurality of connecting holes disposed therethrough adjacent the first edge. Each of the holes is electrically isolated from the others and each is electrically connected to electronic circuitry printed on the first circuit board. The assembly further includes a second circuit board having a first edge and a plurality of connecting holes disposed therethrough adjacent the first edge. Each of the holes of the second board is electrically isolated from the others and is electrically connected to electronic circuitry printed on the second circuit board. The assembly also includes a conductive support plate having a plurality of connecting legs extending therefrom along a first edge thereof. The second circuit board is placed in registry with the plate, with the legs extending through the connecting holes of the second circuit board. The legs also extend through the connecting holes of the first circuit board, with the plate and the second circuit board being oriented at an angle with respect to the first circuit board. The legs are adapted to be soldered to the first circuit board and the second circuit board, and are adapted to be severed from the plate to form an electrical connection between the first circuit board and the second circuit board.

1 Claim, 2 Drawing Sheets

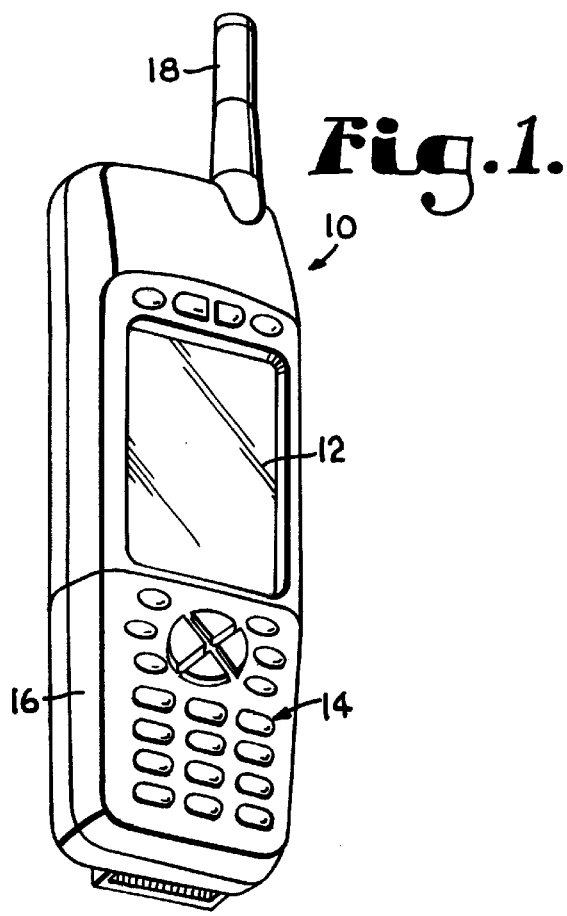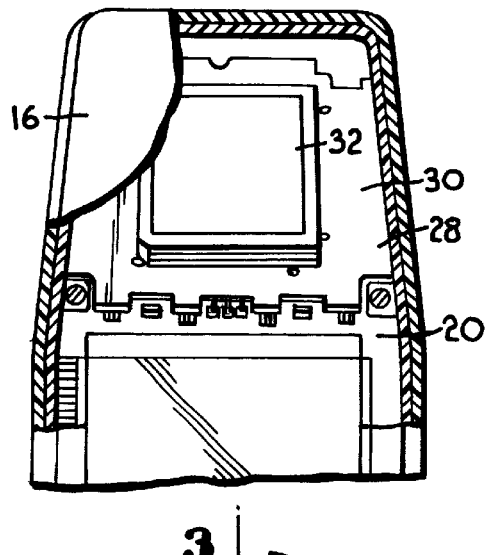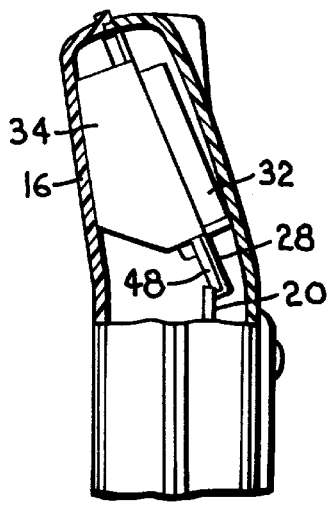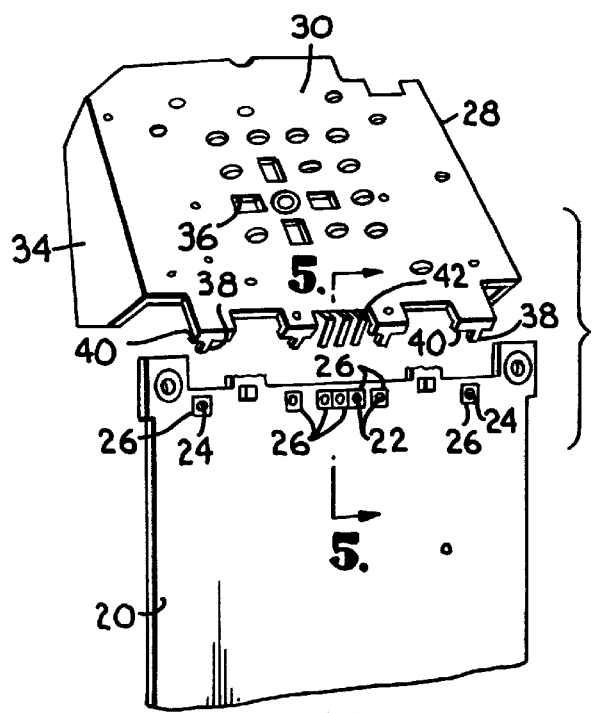

METHOD AND APPARATUS FOR CONNECTING CIRCUIT BOARDS

This is a division of Ser. No. 09/208,905, filed Dec. 10, 1998, now U.S. Pat. No. 6,215,671.

BACKGROUND OF THE INVENTION

The present invention relates to electronic circuit board assemblies. More particularly, the invention is directed to an apparatus that allows two or more circuit boards to be electrically connected together at an angle without the need for a separate connector.

In recent years, the Global Positioning System (GPS) has provided a significant advancement in satellite communications. Individuals engaged in outdoor activities are major users of the GPS system, and they typically make use of hand held receivers to provide positional information. Also in recent years, hand-held cellular telephones have become increasingly popular and have enjoyed widespread use. Only very recently have the GPS system and cellular telephones been combined. Such a combination allows a user of a single device to enjoy all of the benefits of a cellular telephone, while at the same time enjoying the benefits of a GPS device.

Construction of such a device has presented a number of difficulties. Not least among which is the challenge of accommodating all of the necessary circuitry within a device, while keeping the device to a useable and pleasant size and shape. This challenge is not only made difficult by the overall size limitations, but also by the desired shape of cellular telephones. More specifically, it is often the case that a cellular telephone will have a curved or angled shape. In the past, this curved or angled shape limited the useable interior space within the device, because the circuit board or boards could not be angled or economically connected at an angle. In a combination cellular telephone and GPS device, this limitation is particularly disadvantageous due to the increased circuitry required.

Because the casing or housing is curved, a single circuit board will not fit within the casing or housing, so two circuit boards are utilized in a connected manner. The two boards needed are the GPS circuit board for the GPS function of the device and a display board for the cellular telephone and display screen functions of the device. These boards need to be electrically connected to one another. The curved or angled shape of the casing of such a device complicates the accommodation of both boards within the interior thereof.

Prior art devices involving the connection of two or more circuit boards involved the use of a separate connector. This separate connector has isolated connecting pins, typically held within a plastic housing. These connectors are designed to connect two circuit boards either in parallel orientation or in perpendicular orientation to one another. These connectors, however, occupy additional space and are not designed to accommodate other angles of connection.

Therefore, a method and apparatus are needed that overcome the above drawbacks and disadvantages existing in the prior art.

BRIEF SUMMARY OF THE INVENTION

It is an object of the present invention to provide a method and apparatus for connecting two or more circuit boards at a desired angle.

It is a feature of this invention to provide a method and apparatus for connecting two or more circuit boards at a desired angle relative to each other, while not requiring an additional and separate connector.

It is a further object of the invention to provide a method and apparatus for connecting two circuit boards at an angle that allows the two boards to fit within the casing of a combination cellular telephone and GPS device.

According to the present invention, the foregoing and other objects are attained by a circuit board assembly that includes a first circuit board having a first edge and a plurality of connecting holes disposed therethrough adjacent the first edge. Each of the holes is electrically isolated from the others and each is electrically connected to electronic circuitry printed on the first circuit board. The assembly further includes a second circuit board having a first edge and a plurality of connecting holes disposed therethrough adjacent the first edge. Each of the holes of the second board is electrically isolated from the others and is electrically connected to electronic circuitry printed on the second circuit board. The assembly also includes a conductive support plate having a plurality of connecting legs extending therefrom along a first edge thereof. The second circuit board is placed in registry with the plate, with the legs extending through the connecting holes of the second circuit board. The legs also extend through the connecting holes of the first circuit board, with the plate and the second circuit board being oriented at an angle with respect to the first circuit board. The legs are adapted to be soldered to the first circuit board and the second circuit board, and are adapted to be severed from the plate to form an electrical connection between the first circuit board and the second circuit board.

Additional objects, advantages, and novel features of the invention will be set forth in part in the description which follows, and in part will be apparent to those skilled in the practice of the invention. The objects and advantages of the invention may be realized and attained by means of the instrumentalities and combinations particularly pointed out in the appended claims.

BRIEF DESCRIPTION OF THE DRAWINGS

In the accompanying drawings which form a part of this specification and which are to be read in conjunction therewith and in which like reference numerals are used to indicate like parts in the various views:

FIG. 1 is a perspective view of a cellular phone and global positioning satellite device using the circuit board assembly of the present invention;

FIG. 2 is a partial top elevation view of the cellular phone of FIG. 1, with parts being broken away to show particular details of construction;

FIG. 3 is a partial cross sectional view, taken along line 3—3 of FIG. 2;

FIG. 4 is a partial perspective view, showing a display circuit board and the antenna ground plane of the present invention;

DETAILED DESCRIPTION OF THE INVENTION

Figure 5:
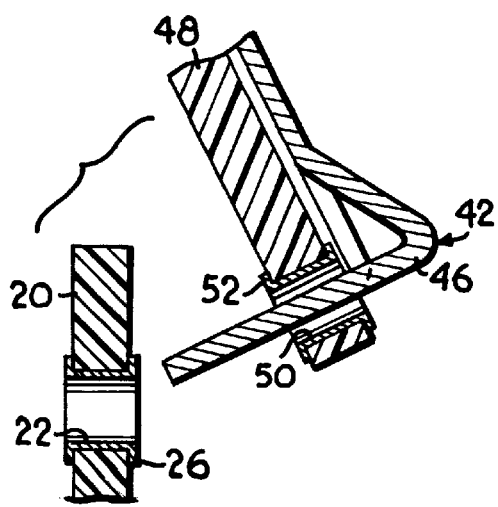
FIG. 5 is a partial cross sectional view taken along line 5—5 of FIG. 4.

A combination cellular telephone and GPS device using the circuit board assembly according to the present invention is broadly designated in the drawings by the reference numeral 10. Device 10 typically has a display screen 12, which is used to visually convey information to the user thereof. Device 10 also has a keypad 14, that allows the user to input information, such as a telephone number. Screen 12 and keypad 14 are held in place within an outer casing 16, extending through which is an antenna 18. Device 10 has a number of internal components that cooperate with keypad 14 and screen 12 to provide an operational cellular telephone and GPS device.

More specifically, as best seen in FIGS. 2 through 4, a display circuit board 20 is provided within the interior of casing 16. Board 20 is generally rectangular and is of the type having a substrate of insulating material formed with conductive film thereon with portions thereof masked and etched away to form a desired circuit. Board 20 also typically has a number of electronic components electrically connected thereto, such as transistors, resistors or integrated circuits. Near the top edge of board 20 are a number of connecting holes 22. There are three connecting holes 22 shown, it being understood that either more or fewer holes could be provided, depending on the design of the system circuitry. Each hole 22 is electrically isolated from the other holes 22 and each hole 22 is operably electrically connected to the circuitry of board 20.

A number of ground plane support holes 24 extend through board 20 near the top edge thereof. Support holes 24 are generally in line with holes 22 and are typically of the same diameter. As shown in the Figures, four holes 24 are provided, it being understood that either more or fewer holes 24 could be used. Each hole 22 and each hole 24 is provided with a conductive liner 26 that operates to make the holes a conductive point for board 20. Liner 26 facilitates a soldering connection, as is more fully described below.

As best seen in FIGS. 3 and 4, an antenna ground plane 28 is located above board 20 and is attached thereto at an angle. Ground plane 28 is constructed of a conductive material, and preferably a metal, and thus acts as a conductive support plate. Ground plane 28 has a large flat surface 30, to which is attached a patch antenna 32. Antenna 32 is used as a component of the GPS function of device 10. Patch antenna 32 is soldered to surface 30, as shown in FIG. 2. Extending downwardly from surface 30 on each side of ground plane 28 is an ear 34. As best seen in FIG. 4, ground plane 28 further has a number of locating pins 36 protruding downwardly therefrom. Only one pin 36 is shown, but in the preferred embodiment that are four pins 36. Pins 36 are used to locate a GPS circuit board, as is more fully described below.

Ground plane 28 has a number of ground plane connecting pins 38 extending orthogonally from surface 30 near the lower edge thereof. Each pin 38 has a stop shoulder 40 located approximately mid-way between surface 30 and the outer tip of each pin 38. Pins 38 are spaced to correspond to the spacing of holes 24 and are sized to fit within holes 24. Shoulders 40 prevent pins 38 from extending further into holes 24 than is desired.

Figure 7:
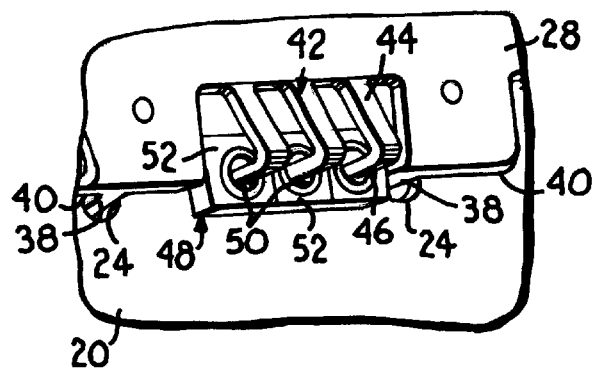
FIG. 7 is a partial perspective view of the connectors inserted into both circuit boards.

As best seen in FIGS. 4 and 7, a number of connecting legs 42 are provided along the lower edge of ground plane 28. As shown, three legs 42 are provided, the number of legs 42 corresponding to the number of holes 22. Each leg 42 has an angled portion 44 that extends upwardly from surface 30. Each leg 42 also has a connecting portion 46 that extends back towards surface 30 and at a right angle thereto. Portion 46 extends approximately the same distance below surface 30 as do pins 38.

As best seen in FIGS. 3 through 8, device 10 is equipped with a GPS circuit board 48 that is located directly under ground plane 28. Board 48 has the electronic circuitry printed thereon as necessary to operate the GPS functions of device 10, as is known within the art. Further, board 48 typically has a number of electronic components electrically coupled to the surface thereof. Board 48 further has a number of locating holes disposed therethrough which correspond in location to pins 36 and serve to properly orient board 48 with respect to ground plane 28. As best seen in FIG. 7, near the middle, lower edge of board 48 are a number of connecting holes 50. As with holes 22 and 24, each hole 50 has an associated conductive liner 52. The number and location of holes 50 corresponds to the number and location of holes 22 and legs 42. Each hole 50 is electrically isolated from the other holes 50, and each hole 50 is operably electrically connected to the circuitry of board 48.

Boards 20 and 48 can be electrically coupled together using the above components and can be coupled together at an angle that allows them to fit within the interior of casing 16, as best seen in FIG. 3. More specifically, in connecting boards 20 and 48, antenna 32 is soldered to ground plane 28 and board 48 is placed on the opposite side of ground plane 28. Pins 36 are placed through the locating holes in board 48 to properly orient board 48 with respect to ground plane 28. Further, each connecting portion 46 of each leg 42 is placed through a corresponding hole 50, as shown in FIG. 5. Thereafter, ground plane 28 is placed in registration with board 20. In this assembly, each connecting portion 46 of each leg 42 is placed through a corresponding hole 22. Also, each pin 38 is placed in a corresponding hole 24, until shoulders 40 are adjacent the surface of board 20.

Figure 6:
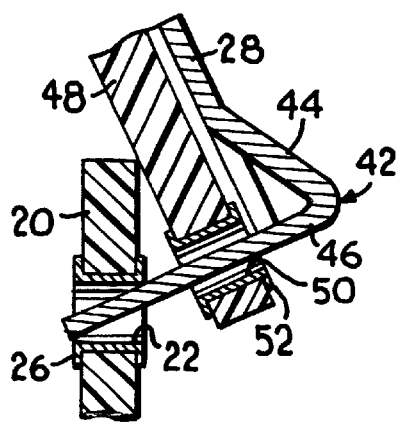
FIG. 6 is a view similar to FIG. 5, shown with the connectors inserted into the display board.
Figure 8:
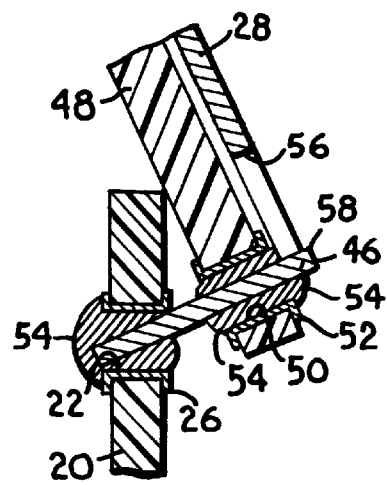
FIG. 8 is a view similar to FIG. 6, shown with the connectors soldered in place and with the connector in its final form.

Because pins 38 and legs 42 are smaller than the corresponding holes 22 and 24, ground plane 28 and board 48 can be oriented at an angle relative to board 20, as shown in FIGS. 5, 6 and 8. After pins 38 and legs 42 have been placed through the corresponding holes 22 and 24, each is soldered to the side of board 20 opposite shoulders 40. This soldering couples ground plane 28 to board 20, and electrically couples connecting portion 46 of legs 42 to board 20. Thereafter, each connecting portion 46 is soldered to board 48 at holes 50, electrically coupling portion 46 to board 48. By soldering legs 42 to both boards 20 and 48, the two boards are electrically coupled to one another. The solder joints are shown at 54 in FIG. 8.

After soldering boards 20 and 48 to portions 46, the angled portion 44 of each leg 42 is removed by cutting through portion 44. As shown in FIG. 8, a cut is made at a first point 56 and at a second point 58. By cutting each leg 42 in this fashion, each leg 42 is electrically connected only between boards 20 and 48, and not to ground plane 28. Each leg 42 therefore operates to connect the two boards, without providing a short circuit to ground plane 28.

The resulting circuit board assembly allows boards 20 and 48 to be electrically connected to one another and still be oriented at an angle relative to one another without having the need for a separate connector piece. This angled orientation is particularly suitable for use in a combination cellular phone and GPS device.

From the foregoing, it will be seen that this invention is one well adapted to attain all of the ends and objects hereinabove set forth, together with other advantages which are inherent to the structure. It will be understood that certain features and subcombinations are of utility and may be employed without reference to other features and subcombinations. This is contemplated by and is within the scope of the claims.

Since many possible embodiments may be made of the invention without departing from the scope thereof, it is to be understood that all matter herein set forth or shown in the accompanying drawings is to be interpreted as illustrative and not in a limiting sense.

Having thus claimed the invention, what is claimed is:

1. An antenna ground plane for use in a combination GPS and cellular telephone device, comprising:

a ground plane flat surface adapted to accommodate a patch antenna of the device; and a plurality of connecting legs extending upwardly away from said surface, said legs having an angled portion that extends upwardly from said surface and a connecting portion that extends downwardly from said angled portion and below said surface, said legs being adapted to be placed through connecting holes on two circuit boards of the device with the two circuit boards oriented at an angle relative to one another, wherein said legs are made of a conductive material adapted to be electrically connected to the two circuit boards, and wherein said legs are adapted to be severed from the surface after said legs have been electrically connected to the two circuit boards.

* * * * *